(12) United States Patent
Moyal et al.

(10) Patent No.: US 7,154,345 B2
(45) Date of Patent: Dec. 26, 2006

(54) PLL CIRCUIT HAVING REDUCED CAPACITOR SIZE

(75) Inventors: Miki Moyal, München (DE); Gerd Rombach, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 10/979,553

(22) Filed: Nov. 1, 2004

(65) Prior Publication Data

US 2005/0122174 A1  Jun. 9, 2005

(30) Foreign Application Priority Data

Oct. 31, 2003  (DE)  ................. 103 51 101

(51) Int. Cl.
*H03L 7/00* (2006.01)
(52) U.S. Cl. ......................................... 331/17; 327/157
(58) Field of Classification Search .................. 331/17; 327/157
See application file for complete search history.

(56) References Cited

U.S. PATENT DOCUMENTS 5,384,502 A  1/1995  Volk 6,222,421 B1 *  4/2001  Kiyose .......................... 331/17
6,538,519 B1 *  3/2003  Lo et al. ........................ 331/17
2003/0034846 A1 *  2/2003  Fan ............................... 331/17

FOREIGN PATENT DOCUMENTS

DE  10050294 A1  7/2002

* cited by examiner

*Primary Examiner*—Joseph Chang
(74) *Attorney, Agent, or Firm*—William B Kempler; W. James Brady; Frederick J. Telecky, Jr.

(57) ABSTRACT

A PLL circuit, having a control loop for an input to a VCO including first and second charge pumps eash having an output coupled to the input of the VCO; an RC network having a first resistance and a capacitance and being and RC network coupled to the output of the first charge pump. A second resistance coupled between the output of the first charge pump and the input to the VCO, the valve of the capacitance C being reduced by a factor X, where $$V_{VCO} = \frac{x}{C'} I_{CP2} t + I_{CP2} R2$$

$V_{VCO}$ = VCO input voltage
$I_{cp2}$ is the current output by the second charge pump
$R_2$ = second resistance
$C'$ = new capacitance value = $C*X$
$C$ = original capacitance value.

5 Claims, 1 Drawing Sheet

PLL CIRCUIT HAVING REDUCED CAPACITOR SIZE

TECHNICAL FIELD OF THE INVENTION

The present invention relates to a phase locked loop circuit. More specifically, it relates to a phase lock loop (PLL) circuit which may be integrated on a small substrate area of a chip.

BACKGROUND OF THE INVENTION

Conventionally, a PLL circuit comprises a voltage controlled oscillator, a phase error detector for detecting a phase error between an output of the voltage controlled oscillator and an external reference signal, and a loop filter inserted between an error signal output of the phase error detector and a control voltage input of the voltage controlled oscillator. A frequency divider may be provided between the output of the oscillator and an input of the phase error detector.

As shown in FIG. 1, a loop filter in a conventional PLL comprises a charge pump CP which is directly controlled by an error signal from a phase error detector PED and an RC series combination which is connected between a fixed supply terminal on the one hand and a connecting node between the current output of the charge pump CP and the control input of the voltage controlled oscillator VCO, on the other hand. The phase error detector PED has a first input receiving a reference frequency signal $f_{in}$ and a second input receiving the output of a frequency divider DIV, the input of which is connected to the output of the voltage controlled oscillator VCO. The output of voltage controlled oscillator VCO is the desired output signal of frequency $f_{out}$. The control voltage $V_{VCO}$ of the oscillator VCO in such a circuit is given by $$V_{VCO} = \frac{1}{C}It + RI, \quad (1)$$

wherein C is the capacity and R is the resistance of the RC series combination, I is the current from the charge pump CP and t is the time.

Usually, for low bandwidth PLLs, if the capacitor C is formed on chip, it often covers more than 70% of the whole PLL circuit area. It would therefore be desirable to be able to reduce the capacitor area and, thus, the chip size. However, there is a problem in that the damping and bandwidth of the PLL circuit depend on the size of the capacitor C. Damping is given by $$s = \frac{1}{2}\sqrt{\frac{IK_{VCO}R^2C}{N}}, \quad (2)$$

wherein $K_{VCO}$ is the gain of the voltage-controlled oscillator, and N is the dividing ratio of frequency divider DIV.

Bandwidth is given by $$\omega_n = \sqrt{\frac{IK_{VCO}}{NC}}. \quad (3)$$

It is readily apparent that if the capacitor is to be reduced without reducing damping and bandwidth, it is necessary to increase the resistance R. An increased resistor value has several disadvantages. Matching becomes difficult, and the effect of thermal noise also increases.

So-called self-biased PLL circuits have a loop filter, which comprises two identical charge pumps in parallel. Instead of an RC series combination, there is a capacitor connected to the current output of one of the charge pumps and a resistor connected to the current output of the other. For a given damping and bandwidth, the values of capacitor and resistor are the same as for a conventional loop filter having a single charge pump.

SUMMARY OF THE INVENTION

A PLL circuit comprises a voltage controlled oscillator (VCO), a phase error detector (PED) for detecting a phase error between an output signal from said voltage controlled oscillator (VCO) divided by a frequency divider (DIV) and a reference signal (fin), and a loop filter (LF) inserted between an error signal output of said phase error detector (PED) and a control input of said voltage controlled oscillator (VCO), wherein said loop filter (LF) comprises two charge pumps ($C_{P1}$, $C_{P2}$), each delivering a respective output current ($I_{CP1}$, $I_{CP2}$) according to a level of the error signal at said error signal output. A first resistor ($R_2$) and a first transistor ($N_2$), the first resistor ($R_2$) has a first terminal connected to a first supply potential (V+) and the first transistor ($N_2$) has a current path connected between a second terminal of the first resistor ($R_2$) and a second supply potential (GND), A capacitor (C'), a first electrode of which is connected to the current output of the first charge pump ($C_{P1}$) and a second electrode of which is connected to one of said supply potentials (V+), and a control circuit (OA, $N_1$, $R_1$) has an input connected to the first electrode of said capacitor (C') and an output connected to a control electrode of said first transistor ($N_2$), for controlling the equivalent resistance of the first transistor ($N_2$) so that said equivalent resistance divided by the resistance value of the first resistor ($R_2$) equals the potential difference between said second supply potential (GND) and said first electrode of said capacitor (C') divided by the potential difference (VC') between said first supply potential (V+) and said first electrode of said capacitor (C'), an intermediate point between said first resistor ($R_2$) and said first transistor ($N_2$) being connected to a current output of said second charge pump ($C_{P2}$) and connected to the control voltage input of the voltage controlled oscillator $_{vand}$ the output current of the first charge. pump ($C_{P1}$) for a given level of the error signal being less than the output current of the second charge pump ($C_{P2}$).

In a PLL circuit, a control loop for an input to a (VCO) comprises a first and second charge pumps each has a output coupled to the inout of the (VCO; an RC network having a first resistance and a capacitance and being coupled to the output of the first charge pump; a second resistance coupled between the output of the first charge pump and the input to the $V_{CO}$, wherein the valve of the capacitance C is reduced by a factor X, here $$V_{VCO} = \frac{x}{C'}I_{CP2}t + I_{CP2}R2$$

and $V_{CO}$=$V_{CO}$ input voltage. $I_{cp2}$ is the current output by the second charge pump, $R_2$=second resistance, C'=new capacitance value=C* X; and C=original capacitance value. In a PLL circuit, a control loop for an input to a (VCO) comprises first and second charge pumps each having an output coupled to the inout of the (VCO;) an RC network having a first resistance and a capacitance and being coupled to the output of the first charge pump; a second resistance coupled between the output of the first charge pump and the input to the (VCO), wherein the valve of the capacitance C is reduced by a factor x, where $$V_{CO} = \frac{1}{C'}I_{CP1}t + I_{CP2}R$$

and $I_{cp1}$=x=is the current output by the first charge pump; $I_{cp2}$=0<x<1=current output of second charge pump; Vco=Vco input voltage; C'=new capacitance value=C*; C=original capacitance value.

In a PLL circuit, a control loop for an input to a (VCO) comprising:

first and second charge pumps each having an output coupled to the inout of the (VCO);

an RC network having a first resistance and a capacitance and being coupled to the output of the first charge pump;

a second resistance coupled between the output of the first charge pump and the input to the (VCO), wherein the valve of the capacitance C is reduced by a factor x, where $$V_{CO} = \frac{1}{C'}I_{CP1}t + I_{CP2}R$$

and
$I_{cp1}$=x=is the current output by the first charge pump
$I_{cp2}$=0<x<1=current output of second charge pump
Vco=Vco input voltage
C'=new capacitance value=C*X
C=original capacitance value.

It is a general object of the present invention to provide a PLL circuit which may be integrated on less substrate area than the conventional PLL circuits described above without affecting damping and bandwidth.

This and other objects and features are achieved by a PLL circuit, in which, both the capacitor and the output current of the first charge pump may be reduced over a conventional self-biased PLL circuit, since the relative contribution of the first charge pump to the control voltage applied to the voltage controlled oscillator does not depend directly on the current output by the first charge pump and the capacitor charged by it, but on the current flowing through the first resistor and the first transistor.

The control circuit may be formed of a second resistor and a second transistor connected in series between the first and second supply potentials and an operational amplifier having an output connected to control electrodes of the first and second transistors, a non-inverting input connected to an intermediate point between the second resistor and the second transistor, and an inverting input connected to the current output of the first charge pump. By this design, the equivalent resistance of the second transistor, divided by the resistance of the second resistor, equals the potential difference between the second supply potential and a first electrode of the capacitor, divided by the potential difference between said first supply potential and the first electrode of the capacitor. Since there is no other current source connected to the intermediate point between the second resistor and the second transistor, the potential at this point will be equal to the potential present at the inverting input of the operational amplifier, and accordingly, the equivalent resistance of the first transistor may easily be controlled such that this equivalent resistance divided by the resistance of the first resistor also equals the potential difference between the second supply potential and the first electrode of the capacitor divided by the potential difference between the first supply potential and the first electrode of the capacitor. In one preferred embodiment; this condition is satisfied by having the first and second resistors being identical and the first and second transistors being identical.

BRIEF DESCRIPTION OF THE DRAWINGS

Further features and advantages of the invention will become apparent from the following description of an exemplary embodiment and the appended drawing.

DETAILED DESCRIPTION

Figure 1:
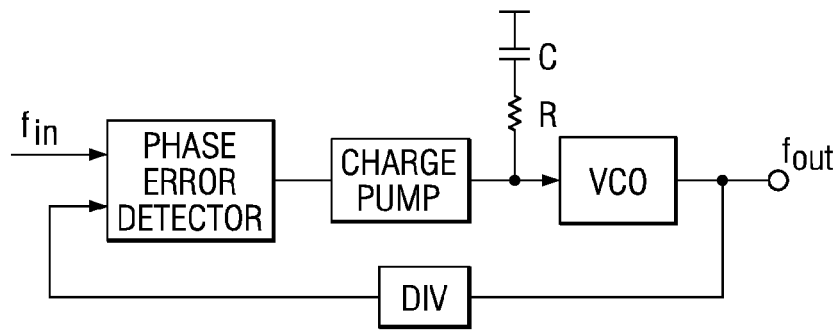
FIG. 1 is a block diagram of a conventional PLL circuit.
Figure 2:
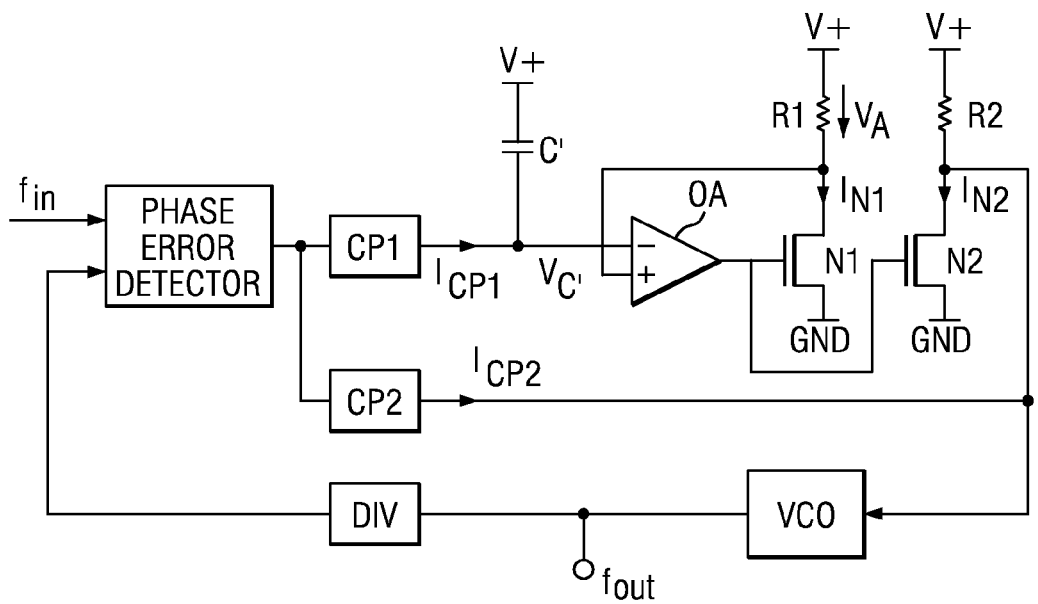
FIG. 2 is a block diagram of a PLL circuit according to the invention.

In FIG. 2, the voltage controlled oscillator VCO, 1/N frequency divider DIV and phase error detector PED are the same as in the conventional PLL circuit of FIG. 1 and will not be described anew. The error signal output of phase error detector PED is connected to control inputs of two charge pumps $C_{P1}$, $C_{P2}$. The two charge pumps $C_{P1}$, $C_{P2}$ are designed to deliver output currents $I_{CP1}$, $I_{CP2}$ that depend on the level of the error signal from phase error detector PED. The amount of $I_{CP1}$ is smaller than that of $I_{CP2}$ for any level of the error signal. The current $I_{CP1}$ from the first charge pump $C_{P1}$ charges a capacitor C', one electrode of which is connected to the current output of the first charge pump $CP_1$ and the other electrode of which is connected to a positive supply voltage V+. A voltage $V_{C'}$ between the two electrodes of the capacitor C' is given by $$V_{C'} = \frac{1}{C'}I_{CP1}t. \qquad (4)$$

An operational amplifier OA has an inverting input connected to the first electrode of capacitor C' and to the current output of charge pump $C_{P1}$. An output of the operational amplifier OA is connected to a gate of a FET transistor $N_1$ that will be referred to in the following as the second transistor, thus controlling the equivalent resistance of the second transistor $N_1$. The source of second transistor $N_1$. is grounded, whereas the drain is connected to a non-inverting input of operational amplifier OA and, via a second resistor $R_1$, to the supply voltage V+. The operational amplifier OA controls the gate potential of the second transistor $N_1$. such that the potentials at the inputs of operational amplifier OA become equal, i.e., that the voltage drop $V_A$ across the second resistor $R_1$ equals $V_{C'}$. That is, the current $I_{N1}$ across the second transistor $N_1$. equals $$I_{N1} = \frac{V_{C'}}{R1} \quad (5)$$

The output of operational amplifier OA is further connected to the gate of a first FET transistor $N_2$ which, together with a first transistor $R_2$, forms a series connection between V+ and ground, similar to $N_1$ and $R_1$. An intermediate point between the first transistor $N_2$ and the first resistor $R_2$ is connected to the current output of the second charge pump $C_{P2}$ and to the control input of voltage controlled oscillator VCO. The two FET transistors $N_1$, $N_2$ and the resistors $R_1$, $R_2$ are selected such that for a relevant range of gate potentials of the transistors, $$\frac{R_1}{R_{N1}} = \frac{R_2}{R_{N2}} \quad (6)$$

wherein $R_{N1}$, $R_{N2}$ denote the equivalent ON resistance values of transistors $N_1$, $N_2$. Due to this selection, the voltage across $R_2$ would equal VC if the current $I_{CP2}$ from the second charge pump $C_{P2}$ was zero. In fact, the current from the second charge pump $C_{P2}$ causes an additional voltage $I_{CP2}*R_2$ across the first resistor $R_2$, i.e. the voltage $V_{VCO}$ at the control input of voltage controlled oscillator VCO is the total voltage caused at $R_2$ by the currents through the first transistor $N_2$ and through the second charge pump $C_{P2}$:

$$V_{VCO} = I_{N2}R2 + I_{CP2}R2 \quad (7)$$

Since V+=$I_{N1}$(R1+$R_{N1}$)=$I_{N2}$(R2+$R_{N2}$), $I_{N2}$ may be written as $$I_{N2} = I_{N1} \frac{R1 + R_{N1}}{R2 + R_{N2}}. \quad (8)$$

Combining eqns. (7) and (8) gives $$V_{VCO} = I_{N1} \frac{R1 + R_{N1}}{R2 + R_{N2}} R2 + I_{CP2}R2. \quad (9)$$

Combining eqns. (9) and (5) yields $$V_{VCO} = \frac{1}{C'R1} I_{CP1} t \cdot \frac{R1 + R_{N1}}{R2 + R_{N2}} R2 + I_{CP2}R2. \quad (10)$$

Since the two currents $I_{CP1}$, $I_{CP2}$ in eqn. (10) are independent from one another, they may be set to different values.

If $I_{CP1}$ is selected as $$I_{CP1} = x \frac{R1}{R2} \frac{R2 + R_{N2}}{R1 + R_{N1}} I_{CP2}, \quad (11)$$

x being an arbitrary constant, eqn. (10) yields $$V_{VCO} = \frac{x}{C'} I_{CP2} t + I_{CP2}R2, \quad (12)$$

i.e., if x/C' is selected equal to C of eqn. (1), and if $R_2$ of FIG. 2 equals R of FIG. 1, then the PLL circuit of FIG. 2 will behave just like the circuit of FIG. 1. The variable x may be assigned any desired value. If, e.g., x=0.5 is chosen, the circuit of FIGS. 1 and 2 will behave identically if C'=0.5 C. That is, the capacitor C' may be reduced by an arbitrary factor x without affecting the behaviour of the PLL, provided that the first charge pump $C_{P1}$ is designed to deliver the current $I_{CP1}$ specified by eqn. (12). In this way, a PLL circuit occupying a very small substrate surface may be designed.

The simplest way to satisfy eqn. (6) is to choose identical resistors $R_1$, $R_2$ and identical transistors $N_1$, $N_2$. Then eqn. (10) simplifies to $$V_{VCO} = \frac{1}{C'} I_{CP1} t + I_{CP2}R, \quad R = R_1 = R_2. \quad (13)$$

In this case, if the charge pumps are designed such that $I_{CP1}$=x $I_{CP2}$, 0<x<1, C' may be reduced by x, and a PLL behaving like that of FIG. 1 will be obtained.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A PLL circuit comprising
a voltage controlled oscillator (VCO), a phase error detector (PED) for detecting a phase error between an output signal from said voltage controlled oscillator (VCO) divided by a frequency divider (DIV) and a reference signal (fin), and a loop filter (LF) inserted between an error signal output of said phase error detector (PED) and a control input of said voltage controlled oscillator (VCO), wherein said loop filter (LF) comprises
two charge pumps ($C_{P1}$, $C_{P2}$), each delivering a respective output current ($I_{CP1}$, $I_{CP2}$) according to a level of the error signal at said error signal output,
a first resistor ($R_2$) and a first transistor ($N_2$), the first resistor ($R_2$) having a first terminal connected to a first supply potential (V+) and the first transistor ($N_2$) having a current path connected between a second terminal of the first resistor ($R_2$) and a second supply potential (GND),
a capacitor (C'), a first electrode of which is connected to the current output of the first charge pump ($C_{P1}$) and a second electrode of which is connected to one of said supply potentials (V+), and a control circuit (OA, $N_1$, $R_1$) having an input connected to the first electrode of said capacitor (C') and an output connected to a control electrode of said first transistor ($N_2$), for controlling the equivalent resistance of the first transistor ($N_2$) so that said equivalent resistance divided by the resistance value of the first resistor ($R_2$) equals the potential difference between said second supply potential (GND) and said first electrode of said capacitor (C') divided by the potential difference (VC') between said first supply potential (V+) and said first electrode of said capacitor (C'), an intermediate point between said first resistor ($R_2$) and said first transistor ($N_2$) being connected to a current output of said second charge pump ($C_{P2}$) and connected to the control voltage input of the voltage controlled oscillator and the output current of the first charge pump ($C_{P1}$) for a given level of the error signal being less than the output current of the second charge pump ($C_{P2}$).

2. The PLL circuit of claim 1, wherein the control circuit comprises a second resistor ($R_1$) and a second transistor ($N_1$) connected in series between said first and second supply potentials and an operational amplifier (OA) having an output connected to control electrodes of said first and second transistors ($N_1$, $N_2$), a non-inverting input connected to an intermediate point between said second resistor ($R_1$) and said second transistor ($N_1$), and an inverting input connected to the current output of the first charge pump ($C_{P1}$).

3. The PLL circuit of claim 2, wherein said first and second resistors ($R_1$ $R_2$) are identical in resistance and said first and second transistors ($N_1$, $N_2$) have identical values of ON resistance.

4. In a PLL circuit, a control loop for an input to a VCO comprising:

first and second charge pumps each having an output coupled to the input of the VCO;

an RC network having a first resistance and a capacitance and being coupled to the output of the first charge pump;

a second resistance coupled between the output of the first charge pump and the input to the VCO, wherein the value of the capacitance C is reduced by a factor X, where $$V_{VCO} = \frac{x}{C'} I_{CP2} t + I_{CP2} R2$$

and $V_{VCO}$=VCO input voltage
$I_{cp2}$ is the current output by the second charge pump
$R_2$=second resistance
C'=new capacitance value=C*X
C=original capacitance value.

5. In a PLL circuit, a control loop for an input to a (VCO) comprising:

first and second charge pumps each having an output coupled to the input of the (VCO);

an RC network having a first resistance and a capacitance and being coupled to the output of the first charge pump;

a second resistance coupled between the output of the first charge pump and the input to the (VCO), wherein the value of the capacitance C is reduced by a factor x, where $$V_{VCO} = \frac{1}{C'} I_{CP1} t + I_{CP2} R$$

and $I_{cp1}$=x=is the current output by the first charge pump
$I_{cp2}$=0<x<1=current output of second charge pump
$V_{VCO}$=VCO input voltage
C'=new capacitance value=C*X
C=original capacitance value.

* * * * *